(12) United States Patent
Senda et al.

(10) Patent No.: US 9,059,099 B2
(45) Date of Patent: Jun. 16, 2015

(54) THERMAL TREATMENT METHOD OF SILICON WAFER AND SILICON WAFER

(75) Inventors: Takeshi Senda, Niigata (JP); Koji Araki, Niigata (JP)

(73) Assignee: GLOBAL WAFERS JAPAN CO., LTD., Niigata (JP)

( * ) Notice: Subject to any disclaimer, the term of this patent is extended or adjusted under 35 U.S.C. 154(b) by 352 days.

(21) Appl. No.: 13/421,748

(22) Filed: Mar. 15, 2012

(65) Prior Publication Data

US 2012/0241912 A1 Sep. 27, 2012

(30) Foreign Application Priority Data

Sep. 26, 2011 (JP) ................. 2011-208810

(51) Int. Cl.
*H01L 21/322* (2006.01)
*H01L 21/324* (2006.01)
*H01L 21/306* (2006.01)
*H01L 21/02* (2006.01)

(52) U.S. Cl.
CPC .......... *H01L 21/306* (2013.01); *H01L 21/0201* (2013.01); *H01L 21/3225* (2013.01)

(58) Field of Classification Search
USPC .......... 438/662, FOR. 242; 257/913, E21.321
See application file for complete search history.

(56) References Cited

U.S. PATENT DOCUMENTS

| | | | |
|---|---|---|---|
| 5,994,761 A | 11/1999 | Falster et al. | |
| 6,180,220 B1 | 1/2001 | Falster et al. | |
| 6,204,152 B1 | 3/2001 | Falster et al. | |
| 6,306,733 B1 | 10/2001 | Falster et al. | |
| 6,391,796 B1 | 5/2002 | Akiyama et al. | |
| 6,403,450 B1 * | 6/2002 | Maleville et al. | 438/471 |
| 6,534,380 B1 * | 3/2003 | Yamauchi et al. | 438/455 |
| 6,586,068 B1 | 7/2003 | Falster et al. | |
| 6,593,211 B2 | 7/2003 | Sato | |
| 2002/0026893 A1 | 3/2002 | Falster et al. | |
| 2003/0196586 A1 | 10/2003 | Falster et al. | |
| 2010/0330779 A1 * | 12/2010 | Okuno et al. | 438/458 |

FOREIGN PATENT DOCUMENTS

| | | |
|---|---|---|
| JP | 2000-091342 A | 3/2000 |
| JP | 2001-509319 A | 7/2001 |
| KR | 10-0352368 A | 8/2002 |
| KR | 2010-0038152 A | 4/2010 |
| KR | 2010-0100613 | 9/2010 |

* cited by examiner

OTHER PUBLICATIONS

Korean Office Action dated Mar. 11, 2013, without English translation.

*Primary Examiner* — Zandra Smith
*Assistant Examiner* — Mohammad Choudhry
(74) *Attorney, Agent, or Firm* — McGinn IP Law Group, PLLC

(57) ABSTRACT

There is provided a thermal treatment method of a silicon wafer. The method includes the successive steps of: (a) terminating silicon atoms existing on an active surface of the silicon wafer with hydrogen, wherein the active surface is mirror-polished, and a semiconductor device is to be formed on the active surface; (b) terminating the silicon atoms existing on the active surface of the silicon wafer with fluorine; (c) rapidly heating the silicon wafer to a first temperature under an inert gas atmosphere or a reducing gas atmosphere, wherein the first temperature is in a range of 1300° C. to 1400° C.; (d) holding the silicon wafer at the first temperature for a certain time; and (e) rapidly cooling the silicon wafer.

8 Claims, 4 Drawing Sheets

THERMAL TREATMENT METHOD OF SILICON WAFER AND SILICON WAFER

This application claims priority from Japanese Patent Applications No. 2011-062575, filed on Mar. 22, 2011, and No. 2011-208810, filed on Sep. 26, 2011, the entire contents of which are herein incorporated by reference.

BACKGROUND

1. Technical Field

Embodiments described herein relate to a thermal treatment method of a silicon wafer and a silicon wafer.

2. Related Art

For a silicon wafer that is used as a substrate for forming a semiconductor device, there is a demand for an effort to reduce void defects, such as crystal originated particles (COP) or laser scattering tomography defects (LSTD), in the vicinity of the surface of a wafer (hereinafter referred to as the surface layer portion) which acts as a device active area so as to produce a defect-free wafer.

In recent years, a technique has been known as a method of manufacturing the above silicon wafer with a high productivity in which a rapid thermal process (hereinafter also referred to simply as the RTP) is carried out on a silicon wafer having at least the surface on which a semiconductor device is formed mirror-polished (hereinafter the mirror-polished surface will also be termed a polished surface).

As such a technique, JP-T-2001-509319 discloses a thermal treatment method in which a wafer is heated in an atmosphere of an oxygen-containing gas, which is mainly argon or helium, (the inert gas atmosphere termed in the present invention) at a temperature exceeding approximately 1175° C. and an oxygen partial pressure of less than approximately 5000 ppm for less than 60 seconds.

However, in the method as described in JP-T-2001-509319, since the RTP is carried out in an atmosphere of inert gas, such as argon or helium, void defects in the surface layer portion of a wafer can be significantly reduced; however, in a case in which the RTP is carried out at a high temperature exceeding 1175° C. in the above inert gas atmosphere or an atmosphere of reducing gas, such as hydrogen, there is a problem in that the surface roughness of the polished surface is worsened due to the influence of a natural oxidation film foil led on the polished surface of the wafer before the RTP.

Regarding the above problem, JP-A-2000-91342 discloses a thermal treatment method in which the natural oxidation film on the wafer surface is removed by a hydrofluoric acid treatment, and then a thermal treatment is carried out using an RTP apparatus in a 100% hydrogen atmosphere or a mixed gas atmosphere of argon containing 10% or more of hydrogen, whereby the micro-roughness of the wafer surface is decreased, and void defects present on the wafer surface can be removed.

In the method as described in JP-A-2000-91342, since silicon atoms on the wafer surface are terminated with hydrogen by the hydrofluoric acid treatment, it becomes difficult to form the natural oxidation film on the surface. Therefore, deterioration of the surface roughness on the wafer surface can be suppressed even when the RTP is carried out.

However, in order to clear the void defects present on the surface layer portion of the wafer by the RTP, it is necessary to carry out a high-temperature thermal treatment at a minimum of 1000° C. or higher in the inert gas atmosphere or a reducing gas atmosphere, but the bond of the hydrogen atoms terminating the silicon atoms becomes liable to be broken, and the silicon atoms become liable to be exposed on the wafer surface. The silicon atoms exposed in the above manner are unstable and liable to bond with other atoms.

Therefore, for example, when other reactive gas (nitrogen or the like) is present in the above atmosphere, since the reactive gas reacts and bonds with the exposed silicon atoms, and a phenomenon in which the bonds are etched by the atmosphere repeatedly occurs, there are problems in that the surface shape of the wafer is deformed, and the surface roughness is deteriorated.

Furthermore, in a case in which a small amount of oxygen is included in the atmosphere, the exposed silicon atoms react with the oxygen, and an oxidation film is formed on the wafer surface in an island shape. The oxidation film is etched by the atmosphere, but there is another problem in that recess-shaped pits are formed at the etched portions.

The above problems become more remarkable as the thermal treatment temperature is increased in the RTP; however, on the other hand, an increase in the thermal treatment temperature has an advantage of an enhancement of the clearing force of the void defects on the surface layer portion of the wafer.

In addition, the above problems show the same tendency even in a semiconductor device-forming thermal treatment for forming a semiconductor device on the surface of a silicon wafer.

That is, in a case in which the thermal treatment is carried out at a high temperature (for example, 1000° C. or higher) in the semiconductor device-forming thermal treatment, similarly, there is a problem of deterioration of the surface roughness, formation of recess-shaped pits, or the like.

SUMMARY OF THE INVENTION

An object of the present invention is to provide a thermal treatment method of a silicon wafer which can suppress deterioration of the surface roughness, and can suppress occurrence of recess-shaped pits even when an RTP is carried out at a high temperature at which the clearing force of void defects is strong.

Another object of the present invention is to provide a silicon wafer which can, in a semiconductor device-forming thermal treatment, suppress deterioration of the surface roughness, and can suppress occurrence of recess-shaped pits even when the thermal treatment is carried out at a high temperature.

According to one or more illustrative aspects of the present inventions, there is provided a thermal treatment method of a silicon wafer. The method comprises the successive steps of: (a) terminating silicon atoms existing on an active surface of the silicon wafer with hydrogen, wherein the active surface is mirror-polished, and a semiconductor device is to be formed on the active surface; (b) terminating the silicon atoms existing on the active surface of the silicon wafer with fluorine; (c) rapidly heating the silicon wafer to a first temperature under an inert gas atmosphere or a reducing gas atmosphere, wherein the first temperature is in a range of 1300° C. to 1400° C.; (d) holding the silicon wafer at the first temperature for a certain time; and (e) rapidly cooling the silicon wafer.

According to one or more illustrative aspects of the present inventions, step (a) comprises: rinsing the silicon wafer with a hydrogen fluoride-based solution or a hydrogen peroxide-based solution, and step (b) comprises: heating the silicon wafer at a second temperature under a fluorine-based gas atmosphere, wherein the second temperature is in a range of 900° C. to 1250° C.

According to one or more illustrative aspects of the present inventions, there is provided a thermal treatment method of a silicon wafer. The method comprises the successive steps of: (a) terminating silicon atoms existing on an active surface of the silicon wafer with hydrogen by rinsing the silicon wafer with a hydrogen fluoride-based solution or a hydrogen peroxide-based solution, wherein the active surface is mirror-polished, and a semiconductor device is to be formed on the active surface; (b) terminating the silicon atoms existing on the active surface of the silicon wafer with fluorine by heating the silicon wafer at a first temperature under a fluorine-based gas atmosphere, wherein the first temperature is in a range of 900° C. to 1250° C.; (c) rapidly heating the silicon wafer from the first temperature to a second temperature under an inert gas atmosphere or a reducing gas atmosphere, wherein the second temperature is in a range of 1300° C. to 1400° C.; (d) holding the silicon wafer at the second temperature for a certain time; and (e) rapidly cooling the silicon wafer.

According to one or more illustrative aspects of the present invention, there is provided a silicon wafer comprising a mirror-polished surface on which a semiconductor device is to be formed, the mirror-polished surface having silicon atoms terminated with hydrogen and fluorine, wherein a defect density is less than 1 defect/cm$^2$ in a surface layer portion of at least 5 μm deep from the mirror-polished surface.

Other aspects and advantages of the present invention will be apparent from the following description, the drawings and the claims.

DETAILED DESCRIPTION

Figure 1:
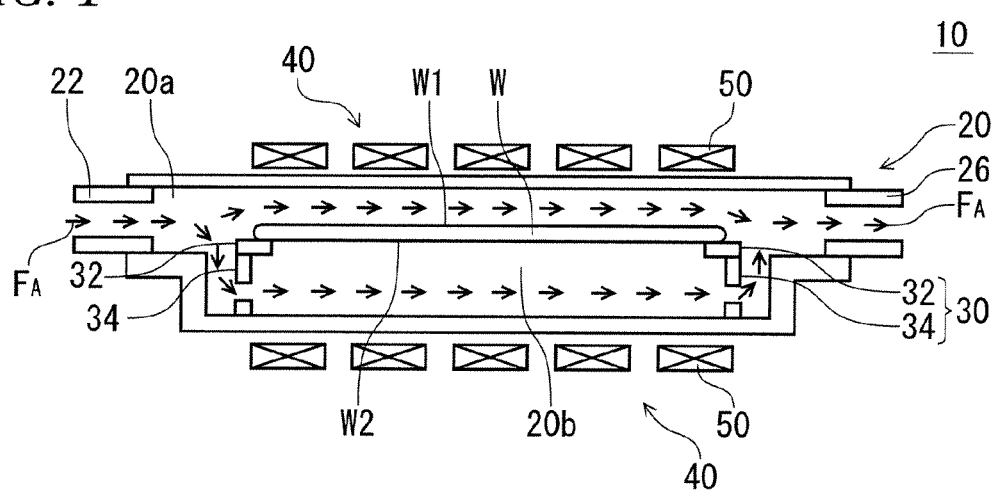
FIG. 1 is a conceptual cross-sectional view showing an example of an RTP apparatus that is applied to the thermal treatment method of a silicon wafer according to the invention.

Exemplary embodiments of the present invention will be now described with reference to the accompany drawings.

There is provided a thermal treatment method of a silicon wafer. The method comprises the successive steps of: (a) terminating silicon atoms existing on an active surface of the silicon wafer with hydrogen, wherein the active surface is mirror-polished, and a semiconductor device is to be formed on the active surface; (b) terminating the silicon atoms existing on the active surface of the silicon wafer with fluorine; (c) rapidly heating the silicon wafer to a first temperature under an inert gas atmosphere or a reducing gas atmosphere, wherein the first temperature is in a range of 1300° C. to 1400° C.; (d) holding the silicon wafer at the first temperature for a certain time; and (e) rapidly cooling the silicon wafer.

As such, when silicon atoms at least on a polished surface of a silicon wafer on which a semiconductor device is formed are terminated with hydrogen and fluorine, deterioration of the surface roughness can be suppressed, and occurrence of recess-shaped pits due to the influence of a small amount of oxygen included in the atmosphere can be suppressed even when an RTP is carried out at a high temperature of 1300° C. to 1400° C. at which a clearing force of void defects is strong.

That is, when the silicon atoms on the polished surface are terminated not only with hydrogen but also with fluorine, a bonding force between the hydrogen and the silicon atoms can be further increased than in a case in which the silicon atoms are terminated only with hydrogen. Therefore, the bond is not easily broken and stays in a stable state even at a high temperature of 1300° C. to 1400° C.

Therefore, even when another reactive gas (nitrogen or the like) is present in the atmosphere, bonding between the silicon atoms and the reactive gas can be suppressed, and therefore deterioration of the surface roughness of the polished surface of the wafer can be suppressed. In addition, even when a small amount of oxygen is included in the atmosphere, the reaction between the oxygen and the silicon atoms can be suppressed, and therefore occurrence of recess-shaped pits can also be suppressed.

The RTP is preferably held in a temperature range of 1300° C. to 1400° C.

In a case in which the temperature range is lower than 1300° C., there is a problem in that the clearing force of void defects is degraded. In a case in which the temperature range exceeds 1400° C., since the temperature range becomes close to the melting point of silicon, there is a possibility of the silicon wafer being softened or melted, which is not preferable.

The temperature range is more preferably 1300° C. to 1380° C. from the viewpoint of the service life of the apparatus as an RTP apparatus that is used to carry out the RTP (as described below).

Rare gas, such as helium (He), argon gas (Ar), or xenon gas (Xe), is preferably used as the inert gas. The inert gas is argon gas (Ar).

Hydrogen gas ($H_2$) is preferably used as the reducing gas.

The silicon wafer, in which at least the surface on which a semiconductor device is formed is mirror-polished, is manufactured by being cut out from a silicon single crystal ingot grown by the Czochralski method (hereinafter referred to as CZ method).

Growing a silicon single crystal ingot by the CZ method is carried out by a well-known method.

Specifically, the silicon single crystal ingot can be grown by heating a silicon raw material filled in a quartz crucible so as to produce silicon melt, bringing a seed crystal into contact with the surface of the silicon melt, pulling up the seed crystal while rotating the seed crystal and the quartz crucible, causing crystal growth so as to form a neck portion, a crown portion, and a straight body portion along the seed crystal, and then cutting the portions away from the silicon melt.

Next, a part is cut out from the grown silicon single crystal ingot by a well-known method, and is processed into a silicon wafer in which at least the surface on which a semiconductor device is formed is mirror-polished.

Specifically, the straight body portion of the silicon single crystal ingot is cut out into a wafer shape using an inner diameter blade or a wire saw, and processes, such as chamfering, wrapping, etching, and mirror polishing, are carried out on the outer circumferential portion.

The process for terminating with hydrogen is a process for rinsing the silicon wafer using a hydrogen fluoride-based solution or hydrogen peroxide-based solution, and the process for terminating with fluorine is preferably a process in which a thermal treatment is carried out on the silicon wafer at a temperature range of 900° C. to 1250° C. in a fluorine-based gas atmosphere.

With the above configuration, the silicon atoms on the surface of the silicon wafer can be efficiently terminated with hydrogen and fluorine.

In a case in which the temperature range of the process for terminating with fluorine is lower than 900° C., there are cases in which it is difficult to terminate the silicon atoms with fluorine. In a case in which the temperature range of the process exceeds 1250° C., there are cases in which the polished surface of the wafer is etched by the fluorine-based gas, and the surface roughness is deteriorated.

The hydrogen fluoride-based solution mainly includes a hydrofluoric acid solution (HF) and a buffered HF solution ($NH_4F+HF$). The hydrogen peroxide-based solution mainly includes hydrogen peroxide water ($H_2O_2$) or a mixed solution of hydrogen sulfide ($H_2SO_4$) and hydrogen peroxide water ($H_2O_2$). In addition, the fluorine-based gas mainly includes tetrafluoromethane ($CF_4$), sulfur hexafluoride ($SF_6$), and nitrogen trifluoride ($NF_3$).

FIG. 1 is a conceptual cross-sectional view showing an example of an RTP apparatus that is applied to the thermal treatment method of a silicon wafer according to the invention.

An RTP apparatus 10 as shown in FIG. 1 has a reaction chamber 20 for accommodating a wafer W and carrying out a thermal treatment, a wafer holder 30 that is provided in the reaction chamber 20 and holds the wafer W, and a heater 40 that heats the wafer W. In a state in which the wafer W is held in the wafer holder 30, a first space 20a, which is a space surrounded by the inner wall of the reaction chamber 20 and the front surface (device-formed surface) W1 side of the wafer W, and a second space 20b, which is a space surrounded by the inner wall of the reaction chamber 20 and the rear surface W2 side of the wafer W, which is opposite the front surface W1 side, are formed.

The reaction chamber 20 has a supply opening 22 through which an atmosphere gas $F_A$ (solid line arrow) is supplied to the first space 20a and the second space 20b and an exhaust opening 26 through which the supplied atmosphere gas $F_A$ is exhausted from the first space 20a and the second space 20b. The reaction chamber 20 is made of, for example, quartz.

The wafer holder 30 has a susceptor 32 that hold the outer circumferential portion of the rear surface W2 of the wafer W in a ring shape, and a rotating body 34 that holds the susceptor 32 and rotates the susceptor 32 around the center of the wafer W. The susceptor 32 and the rotating body 34 are made of, for example, SiC.

The heater 40 is disposed above the front surface W1 of the wafer W held by the wafer holder 30 and outside the reaction chamber 20 below the rear surface W2, and heats the wafer W from both surfaces. The heater 40 is made of, for example, a plurality of halogen lamps 50.

In a case in which an RTP is carried out using the RTP apparatus 10 as shown in FIG. 1, the wafer W is introduced into the reaction chamber 20 from a wafer introduction opening which is provided at the reaction chamber 20, which is not shown, the outer circumferential portion of the rear surface W2 of the wafer W is held on the susceptor 32 of the wafer holder 30 in a ring shape, the atmosphere gas $F_A$ is supplied, and the wafer W is heated by the heater 40 while rotating the wafer W.

Figure 2:
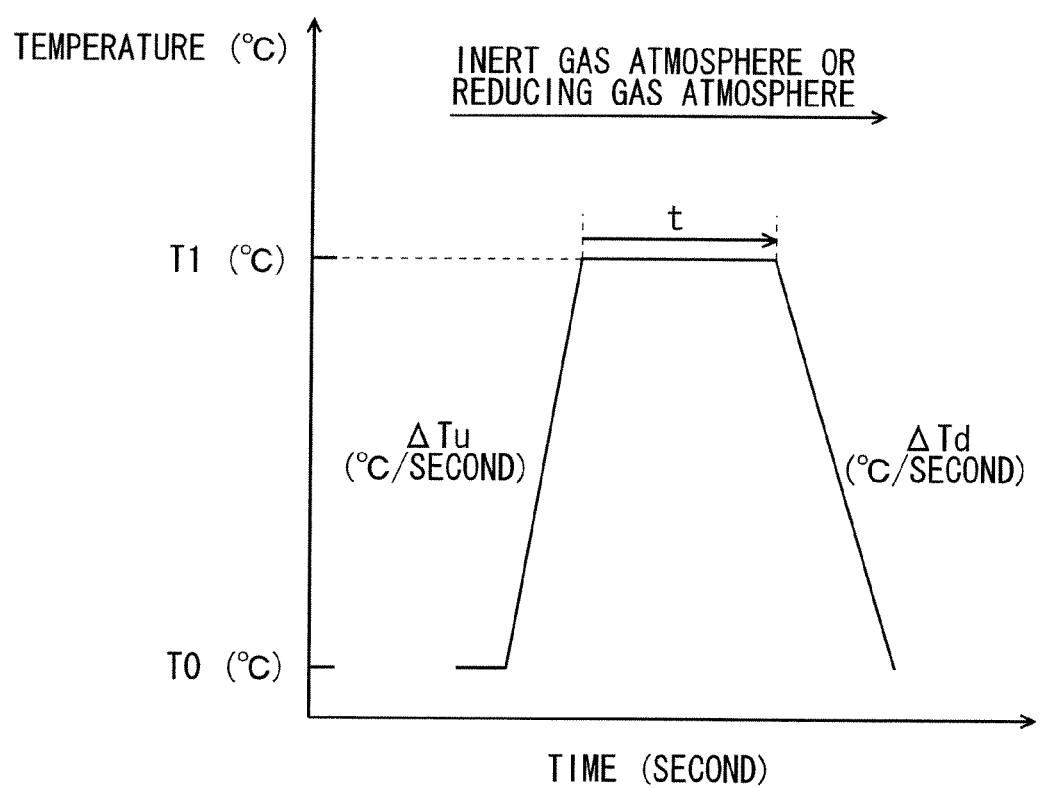
FIG. 2 is a conceptual view showing an example of a thermal treatment sequence in an RTP that is applied to the thermal treatment method of a silicon wafer according to the invention.

FIG. 2 is a conceptual view showing an example of a thermal treatment sequence in an RTP that is applied to the thermal treatment method of a silicon wafer according to the invention.

According to the thermal treatment sequence used for the RTP, as shown in FIG. 2, at least the front surface W1 side on which a semiconductor device is formed is mirror-polished in the reaction chamber 20 of the RTP apparatus 10 as shown in FIG. 1, which is held at a temperature T0 (for example, 500° C.), furthermore, the wafer W having silicon atoms terminated with hydrogen and fluorine on the front surface W1 is installed, and an inert gas or a reducing gas is supplied to the first space 20a and the second space 20b.

Next, the wafer is rapidly heated to a temperature range of 1300° C. to 1400° C. (temperature T1 (° C.)) from the temperature T0 (° C.) at a temperature increase rate ΔTu (° C./second), held constant at the temperature T1 (° C.) for a predetermined time t (seconds), and then rapidly cooled to, for example, the temperature T0 (° C.) at a temperature decrease rate ΔTd (° C./second).

Meanwhile, the temperatures T0 and T1 are the surface temperature of the wafer W, which is measured using a radiation thermometer that is installed below the wafer holder 30, which is not shown, (average temperature in a case in which a plurality of radiation thermometers are disposed in the diameter direction of the wafer W) in a case in which the wafer W is installed in the reaction chamber 20 of the RTP apparatus 10 as shown in FIG. 1.

The process for terminating with fluorine may be separately carried out according to the thermal treatment sequence as shown in FIG. 2 (the atmosphere is a fluorine-based gas, and the temperature T1 (° C.) is a temperature range of 900° C. to 1250° C.) using an apparatus other than the RTP apparatus (for example, a vertical thermal treatment apparatus that carries out a thermal treatment using a vertical boat) before the RTP is carried out. In addition, the process may be carried out according to the thermal treatment sequence as shown in FIG. 2 (the atmosphere is a fluorine-based gas, and the temperature T1 (° C.) is a temperature range of 900° C. to 1250° C.) using a different apparatus from the apparatus for carrying out the RTP or the same RTP apparatus.

More preferably, the process for terminating with fluorine is carried out using the same RTP apparatus and simultaneously with the RTP (by introducing the process for terminating with fluorine to the thermal treatment sequence as shown in FIG. 2).

Next, the preferred embodiment will be described.

A preferred embodiment of the thermal treatment method of a silicon wafer according to the invention has a process in which silicon atoms on the surface of a silicon wafer, on which a semiconductor device is formed and which is mirror-polished, are terminated with hydrogen using a hydrogen fluoride-based solution or a hydrogen peroxide-based solution; a process in which the silicon wafer terminated with hydrogen is rapidly heated to a first temperature range of 900° C. to 1250° C. in a fluorine-based gas atmosphere, and the silicon atoms on the surface are terminated with fluorine; and a process in which, subsequent to the process for terminating with fluorine, the fluorine-based atmosphere is switched to an inert gas atmosphere or a reducing gas atmosphere in the first temperature range, the silicon wafer is rapidly heated to a second temperature range of 1300° C. to 1400° C. and held, and then an RTP for rapidly decreasing the temperature of the silicon wafer is carried out.

That is, when the RTP is carried out, the silicon atoms are terminated with fluorine by carrying out a thermal treatment at a fluorine-based gas atmosphere, and then, continuously, the fluorine-based gas atmosphere is switched to an inert gas atmosphere or a reducing gas atmosphere while the silicon wafer is rapidly heated. The other processes will be the same as in the following method, and thus will not be described.

With the above method, the thermal treatment process for terminating fluorine can be removed, and therefore the productivity can be improved, and costs can be decreased.

Figure 3:
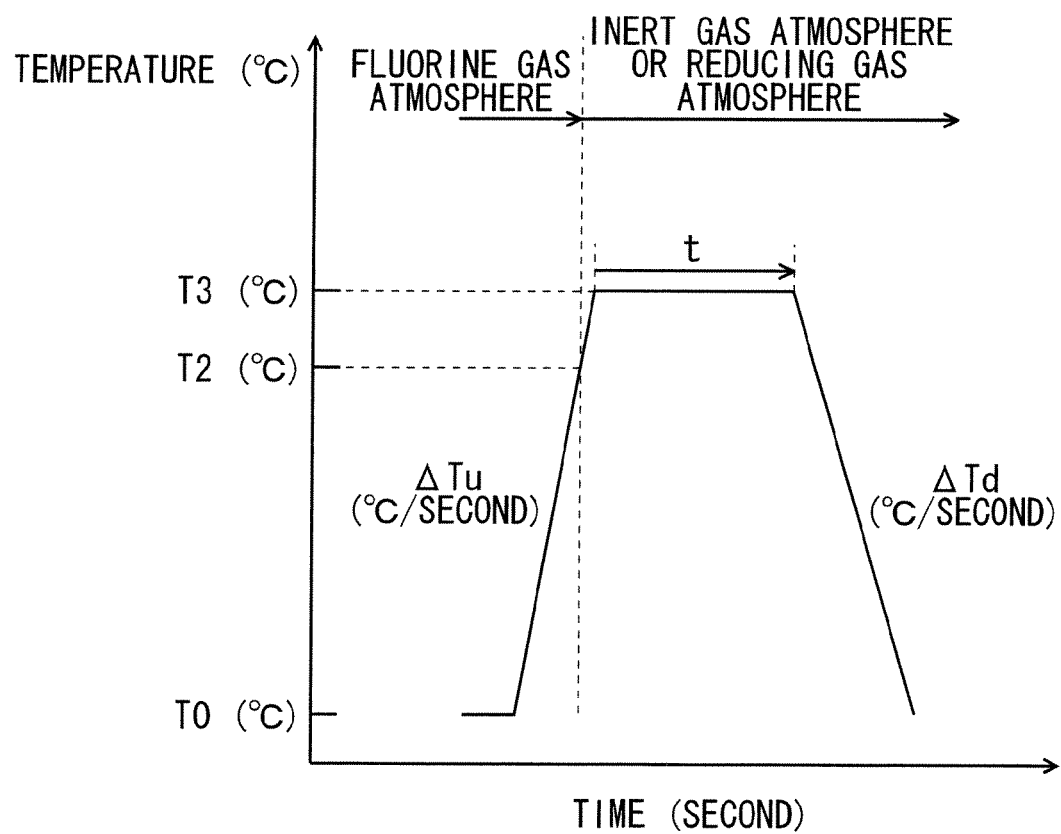
FIG. 3 is a conceptual view showing an example of a thermal treatment sequence in an RTP to explain a preferred embodiment of the thermal treatment method of a silicon wafer according to the invention.

FIG. 3 is a conceptual view showing an example of a thermal treatment sequence in an RTP to explain a preferred embodiment of the thermal treatment method of a silicon wafer according to the invention.

In the thermal treatment sequence as shown in FIG. 3, the wafer W in which at least the front surface W1 side on which a semiconductor element is formed is mirror-polished, and the silicon atoms on the front surface W1 are terminated with hydrogen is disposed in the reaction chamber 20 of the RTP apparatus 10 as shown in FIG. 1, which is held at the temperature T0 (for example, 500° C.), and a fluorine-based gas is supplied to the first space 20a and the second space 20b.

Next, the wafer is rapidly heated to the first temperature range of 900° C. to 1250° C. (temperature T2 (° C.)) from the temperature T0 (° C.) at a temperature increase rate ΔTu (° C./second), thereby terminating fluorine (fluorine-terminating process). After that, continuously, the fluorine-based atmosphere is switched to an inert gas atmosphere or a reducing gas atmosphere in the first temperature range (temperature T2 (° C.)), and the inert gas or the reducing gas is supplied to the first space 20a and the second space 20b.

Next, the silicon wafer is rapidly heated to the second temperature range (temperature T3 (° C.)) of 1300° C. to 1400° C. from the first temperature range (temperature T2 (° C.)) at a temperature increase rate ΔTu (° C./second), held constant in the second temperature range (temperature T3 (° C.)) for a predetermined time t (seconds), and then rapidly cooled to, for example, the temperature T0 (° C.) at a temperature decrease rate ΔTd (° C./second).

Figure 4:
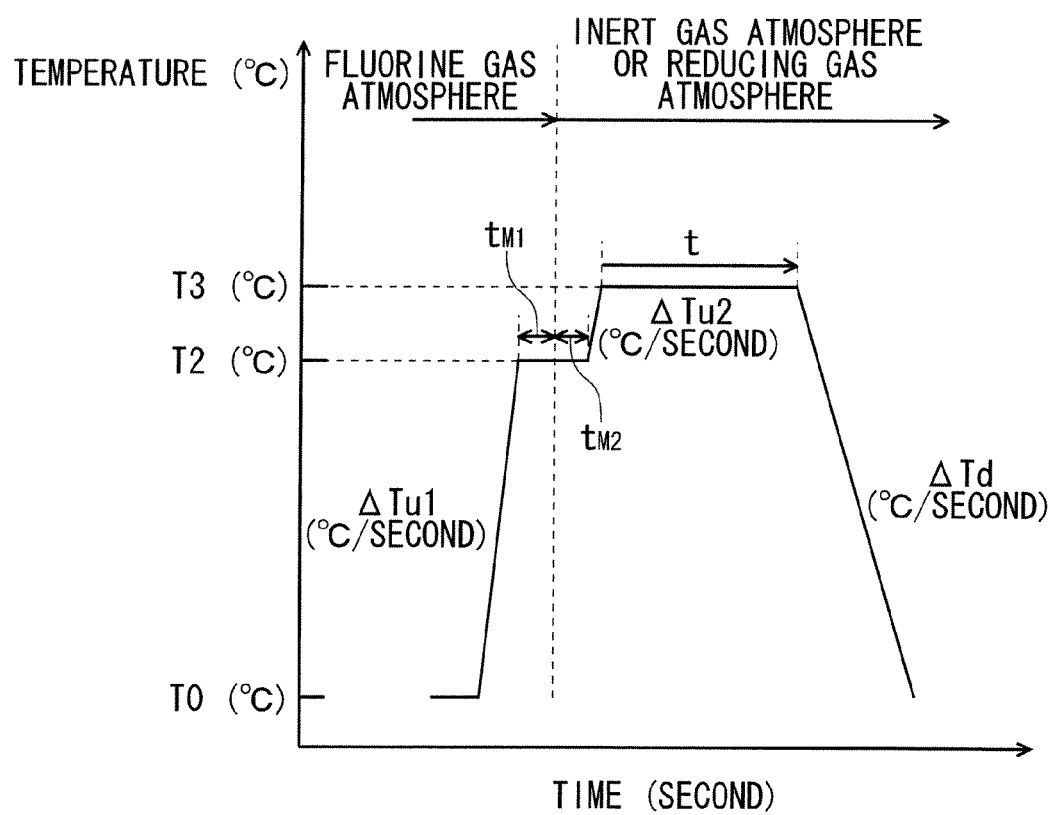
FIG. 4 is a conceptual view showing an example of a thermal treatment sequence in an RTP to explain a more preferred embodiment of the thermal treatment method of a silicon wafer according to the invention.

FIG. 4 is a conceptual view showing an example of a thermal treatment sequence in an RTP to explain a more preferred embodiment of the thermal treatment method of a silicon wafer according to the invention.

As shown in FIG. 4, switching to the inert gas atmosphere or the reducing gas atmosphere from the fluorine-based gas atmosphere is preferably carried out in a state in which the wafer is held constant in the first temperature range (temperature T2 (° C.)).

That is, the RTP is preferably carried out by rapidly heating a silicon wafer in which the silicon atoms on the front surface W1 are terminated with hydrogen to the first temperature range of 900° C. to 1250° C. (temperature T2 (° C.)) at a temperature increase rate ΔTu1 (° C./second) in a fluorine-based gas atmosphere, holding the wafer constant in the first temperature range (temperature T2 (° C.)) for a predetermined time ($t_{M1}$ (seconds)), then, switching the fluorine-based gas atmosphere to the inert gas atmosphere or a reducing gas atmosphere, furthermore, holding the wafer constant for a predetermined time ($t_{M2}$ (seconds)), and then rapidly heating the wafer to the second temperature range of 1300° C. to 1400° C. (temperature T3 (° C.)) at a temperature increase rate ΔTu2 (° C./second).

With the above method, while the productivity is slightly degraded, it becomes possible to reliably terminate fluorine in the fluorine-based gas atmosphere, furthermore, it becomes easy to fully exhaust the fluorine-based gas from the reaction chamber 20 when switching gases. Therefore, there is a decreased risk of the polished surface of the wafer being exposed to the fluorine-based gas at a high temperature exceeding 1250° C., and therefore deterioration of the surface roughness on the polished surface can be suppressed.

The holding time ($t_{M1}$ (seconds)) during which the first temperature range (temperature T2 (° C.)) is held in the fluorine-base gas atmosphere is 1 second to 5 seconds, and the holding time ($t_{M2}$ (seconds)) during which the first temperature range (temperature T2 (° C.)) is held in the inert gas atmosphere or the reducing gas atmosphere after the switching of gases is preferably 1 second to 5 seconds.

With the above holding times, degradation of the productivity is suppressed, fluorine can be reliably terminated, and deterioration of the surface roughness by the fluorine-based gas can also be suppressed.

The temperature increase rates ΔTu, ΔTu1, and ΔTu2 in the RTP are preferably 10° C./second to 150° C./second.

With the above temperature increase rates ΔTu, ΔTu1, and ΔTu2, in the RTP, degradation of the productivity is continuously suppressed, and occurrence of contact traces or slips due to abrupt temperature changes during the rapid temperature increase can be suppressed.

The temperature decrease rate ΔTd in the RTP is preferably 10° C./second to 150° C./second.

With the above temperature decrease rate ΔTd, in the RTP, degradation of the productivity is continuously suppressed, and occurrence of contact traces or slips due to abrupt temperature changes during the rapid temperature increase can be suppressed.

In the thermal treatment sequence of FIG. 4, the temperature increase rate ΔTu1 (° C./second) up to the first temperature range (temperature T2 (° C.)) and the temperature increase rate ΔTu2 (° C./second) from the first temperature range (temperature T2 (° C.)) to the second temperature range (temperature T3 (° C.)) after the switching of gases may be the same temperature increase rate or different temperature increase rates as long as they are 10° C./second to 150° C./second.

The holding time t in the temperature ranges of 1300° C. to 1400° C. (the temperature T1 (° C.) in FIG. 2 and the temperature T3 (° C.) in FIGS. 3 and 4) in the RTP is preferably 1 second to 30 seconds.

With the above holding time t, degradation of the productivity is continuously suppressed, and void defects can be efficiently cleared.

In the silicon wafer according to the invention, at least the surface on which a semiconductor device is formed is mirror-polished, the defect density is less than 1 defect/cm$^2$ in the surface layer portion at least 5 μm deep from the surface, and the silicon atoms on the surface are terminated with hydrogen and fluorine.

As such, since the silicon atoms at least on the polished surface of the silicon wafer on which a semiconductor device is formed are terminated, even when a thermal treatment is carried out at a high temperature in the semiconductor device-forming thermal treatment, deterioration of the surface roughness can be suppressed in the thermal treatment, and occurrence of recess-shaped pits due to a small amount of oxygen included in the atmosphere can also be suppressed.

That is, when the silicon atoms on the polished surface are terminated not only with hydrogen but also with fluorine, a bonding force between the hydrogen and the silicon atoms can be further increased than in a case in which the silicon atoms are terminated only with hydrogen. Therefore, the bond is not easily broken and stays in a stable state even at a high temperature of 1300° C. to 1400° C.

Therefore, even when another reactive gas (nitrogen or the like) is present in the atmosphere of the semiconductor device-forming thermal treatment, bonding between the silicon atoms and the reactive gas can be suppressed, and therefore deterioration of the surface roughness of the polished surface of the wafer can be suppressed. In addition, even when a small amount of oxygen is included in the atmosphere, a reaction between the oxygen and the silicon atoms can be suppressed, and therefore occurrence of recess-shaped pits can also be suppressed.

The area density of hydrogen and fluorine on the surface of the silicon wafer is preferably $1\times10^{22}$ atoms/cm$^2$ or more.

With the above area density, the above effects can be reliably obtained.

EXAMPLES

Hereinafter, the invention will be described more specifically based on examples, but the invention is not limited to the following examples.

Example 1

A silicon single crystal ingot having an area in which vacancy-type defects are present was manufactured by controlling v/G (v: the pulling speed, G: the temperature gradient in the pulling direction in the single crystal) by the CZ method, rinsing was carried out for 5 minutes on a silicon wafer (a diameter of 300 mm, a thickness of 775 μm, and an oxygen concentration of $1.2\times10^{18}$ atoms/cm$^2$ to $1.3\times10^{18}$ atoms/cm$^2$) having both surfaces mirror-polished, which was a cut-out from the above area, by immersing the entire wafer in a hydrofluoric acid solution having a fluorine concentration of 5% (hydrogen terminating treatment), the wafer was rinsed with pure water, and dried through spin drying.

Next, an RTP was carried out on the dried wafer using the RTP apparatus 10 as shown in FIG. 1 according to the thermal treatment sequence as shown in FIG. 3 so as to manufacture an annealed wafer.

Specifically, the dried wafer was injected into a reaction chamber held at 500° C., tetrafluoromethane (CF$_4$) was supplied as the atmosphere, the wafer was rapidly heated to 1000° C. (the first temperature range) at a temperature increase rate of 75° C./second, then, the atmosphere was switched from tetrafluoromethane (CF$_4$) to argon gas (Ar) at 1000° C., the wafer was rapidly heated to 1300° C. (the second temperature range) at a temperature increase rate of 75° C./second, held for 15 seconds at 1300° C., and rapidly cooled to 500° C. at a temperature increase rate of 90° C./second. Meanwhile, it was found from measurement using an oxygen concentration meter installed in the reaction chamber that the argon gas (Ar) included an extremely small amount of oxygen, 0.1 ppm or less.

Example 2

An annealed wafer was manufactured under the same conditions as in Example 1 except that the second temperature range in the RTP was set to 1350° C.

Example 3

An annealed wafer was manufactured under the same conditions as in Example 1 except that the RTP was carried out using the thermal treatment sequence as shown in FIG. 4.

Specifically, the dried wafer was injected into a reaction chamber held at 500° C., tetrafluoromethane (CF$_4$) was supplied as the atmosphere, the wafer was rapidly heated to 1000° C. (the first temperature range) at a temperature increase rate of 75° C./second, then, held constant for 5 seconds at 1000° C., the atmosphere was switched from tetrafluoromethane (CF$_4$) to argon gas (Ar), the wafer was held constant for 5 seconds at 1000° C., then rapidly heated to 1300° C. (the second temperature range) at a temperature increase rate of 75° C./second, held for 15 seconds at 1300° C., and rapidly cooled to 500° C. at a temperature increase rate of 90° C./second. Meanwhile, it was found from measurement using an oxygen concentration meter installed in the reaction chamber that the argon gas (Ar) included an extremely small amount of oxygen, 0.1 ppm or less.

Example 4

An annealed wafer was manufactured under the same conditions as in Example 3 except that the second temperature range in the RTP was set to 1350° C.

Comparative Example 1

An annealed wafer was manufactured under the same conditions as in Example 1 except that the RTP was carried out on a wafer for which the hydrogen terminating treatment was carried out without carrying out the fluorine terminating treatment.

Comparative Example 2

An annealed wafer was manufactured under the same conditions as in Example 1 with the second temperature range set to 1200° C. in the RTP.

The surface roughness on the semiconductor device-formed surfaces of the annealed wafers obtained from the above Examples 1 to 4 and the above Comparative Examples 1 and 2 were evaluated with RMS (measurement range: 3 μm×3 μm) using an atomic force microscope (AFM).

In addition, occurrence of recess-shaped pits on the semiconductor device-formed surface was evaluated by visual observation.

Furthermore, the defect density in the surface layer portion which is 5 μm deep from the wafer surface was evaluated at a wavelength of 680 nm using a laser scattering topography defect scanner (LSTD scanner).

In addition, as a reference example, the surface roughness RMS (measurement range: 3 μm×3 μm) on the semiconductor device-formed surface of a wafer, for which the fluorine terminating treatment was carried out, but the RTP was not carried out, was also evaluated using an AFM. The evaluation results in the present tests are shown in Table 1.

TABLE 1

| | Surface roughness: RMS (nm) | Occurrence of recess-shaped pits | Defect density |
|---|---|---|---|
| Example 1 | 0.15 | No occurrence | Less than 1 defect/cm$^2$ |
| Example 2 | 0.14 | No occurrence | Less than 1 defect/cm$^2$ |
| Example 3 | 0.12 | No occurrence | Less than 1 defect/cm$^2$ |
| Example 4 | 0.11 | No occurrence | Less than 1 defect/cm$^2$ |
| Comparative Example 1 | 0.24 | Occurrence | Less than 1 defect/cm$^2$ |
| Comparative Example 2 | 0.16 | No occurrence | 50 to 60 defect/cm$^2$ |
| Reference Example | 0.20 | — | — |

As shown in Table 1, it is observed that the surface roughness tends to be further degraded in Comparative Example 1 for which the fluorine terminating treatment was not carried out than the reference example. In addition, it is observed that the clearing force of void defects is weak in Comparative Example 2 for which the second temperature range of the RTP was set to 1200° C. Furthermore, it is observed that the surface roughness tends to be better in Examples 1 to 4 for which the fluorine terminating treatment was carried out than the comparative examples and the reference example. In addition, it is observed that the surface roughness tends to be better in Examples 3 and 4 for which a thermal treatment was carried out according to the thermal treatment sequence of FIG. 4 than the thermal treatment sequence (Examples 1 and 2) shown in FIG. 3.

Temperature Change Test 1: Examples 5 to 10

Annealed wafers were manufactured under the same conditions as in Example 1 with the first temperature range changed in the fluorine terminating treatment.

The surface roughness (RMS) and occurrence of recess-shaped pits on the semiconductor device-formed surfaces of the obtained annealed wafers were evaluated by the same method as in Example 1. The test conditions and evaluation results in the present test are shown in Table 2.

TABLE 2

|  | First temperature range (° C.) | Surface roughness: RMS (nm) | Occurrence of recess-shaped pits |
|---|---|---|---|
| Example 5 | 800 | 0.17 | No occurrence |
| Example 6 | 900 | 0.15 | No occurrence |
| Example 7 | 1100 | 0.14 | No occurrence |
| Example 8 | 1200 | 0.13 | No occurrence |
| Example 9 | 1250 | 0.13 | No occurrence |
| Example 10 | 1300 | 0.18 | No occurrence |
| Reference Example | — | 0.20 | — |

As shown in Table 2, when the first temperature range is set to 900° C. to 1250° C., it is observed that the surface roughness: RMS (nm) tends to be better.

Temperature Change Test 2: Examples 11 to 16

Annealed wafers were manufactured under the same conditions as in the temperature change test 1 with the second temperature range set to 1350° C. in the RTP.

The surface roughness (RMS) and occurrence of recess-shaped pits on the semiconductor device-formed surfaces of the obtained annealed wafers were evaluated by the same method as in Example 1. The test conditions and evaluation results in the present test are shown in Table 3.

TABLE 3

|  | First temperature range (° C.) | Surface roughness: RMS (nm) | Occurrence of recess-shaped pits |
|---|---|---|---|
| Example 11 | 800 | 0.15 | No occurrence |
| Example 12 | 900 | 0.12 | No occurrence |
| Example 13 | 1100 | 0.12 | No occurrence |
| Example 14 | 1200 | 0.11 | No occurrence |
| Example 15 | 1250 | 0.12 | No occurrence |
| Example 16 | 1300 | 0.14 | No occurrence |
| Reference Example | — | 0.20 | — |

In the present test, as shown in Table 3, the same tendency as in the temperature change test 1 (when the first temperature range is set to 900° C. to 1250° C., the surface roughness: RMS (nm) tends to be better) is observed.

Semiconductor Device-Forming Thermal Treatment Test: Examples 17 to 32

Another RTP was carried out on the annealed wafers as obtained in Examples 1 to 16 at a peak temperature of 1350° C. The RTP was considered as the thermal treatment (semiconductor device-forming thermal treatment) carried out when forming a semiconductor device.

Specifically, the annealed wafers as obtained in Examples 1 to 16 were injected into a reaction chamber held at 500° C., argon gas (Ar) was supplied as the atmosphere, the wafer was rapidly heated to 1350° C. at a temperature increase rate of 75° C./second, held for 15 seconds at 1350° C., and then rapidly cooled to 500° C. at a temperature increase rate of 90° C./second. Meanwhile, it was found from measurement using an oxygen concentration meter installed in the reaction chamber that the argon gas (Ar) included an extremely small amount of oxygen, 0.1 ppm or less.

In addition, the surface roughness on the semiconductor device-formed surfaces of the wafers, for which the semiconductor device-forming treatment was carried out, was evaluated using an atomic force microscope (AFM) with RMS (measurement range: 3 μm×3 μm). In addition, occurrence of recess-shaped pits on the semiconductor device-formed surfaces was evaluated by visual observation. The test conditions and evaluation results in the present test are shown in Table 4.

TABLE 4

|  | Surface roughness RMS before the semiconductor device-forming thermal treatment (nm) | Surface roughness RMS after the semiconductor device-forming thermal treatment (nm) | Occurrence of recess-shaped pits |
|---|---|---|---|
| Example 17 (Example 1) | 0.15 | 0.14 | No occurrence |
| Example 18 (Example 2) | 0.14 | 0.13 | No occurrence |
| Example 19 (Example 3) | 0.12 | 0.12 | No occurrence |
| Example 20 (Example 4) | 0.11 | 0.11 | No occurrence |
| Example 21 (Example 5) | 0.17 | 0.15 | No occurrence |
| Example 22 (Example 6) | 0.15 | 0.14 | No occurrence |
| Example 23 (Example 7) | 0.14 | 0.14 | No occurrence |
| Example 24 (Example 8) | 0.13 | 0.13 | No occurrence |
| Example 25 (Example 9) | 0.13 | 0.12 | No occurrence |
| Example 26 (Example 10) | 0.18 | 0.17 | No occurrence |
| Example 27 (Example 11) | 0.15 | 0.15 | No occurrence |
| Example 28 (Example 12) | 0.12 | 0.12 | No occurrence |
| Example 29 (Example 13) | 0.12 | 0.12 | No occurrence |
| Example 30 (Example 14) | 0.11 | 0.11 | No occurrence |
| Example 31 (Example 15) | 0.12 | 0.12 | No occurrence |
| Example 32 (Example 16) | 0.14 | 0.14 | No occurrence |

As shown in Table 4, it is observed that deterioration of the surface roughness and occurrence of recess-shaped pits are suppressed even when the semiconductor device-forming thermal treatment is carried out on the annealed wafers as obtained in Examples 1 to 16 (Examples 17 to 32).

Meanwhile, the area densities of hydrogen and fluorine on the semiconductor-formed surfaces (polished surface) of the annealed wafers as obtained in Examples 1 to 16, for which the semiconductor device-forming treatment was not carried out were measured using an X-ray photoelectron spectroscopy (XPS), the area density of hydrogen was $1\times10^{22}$ atoms/cm$^2$ or more, and the area density of fluorine was $1\times10^{22}$ atoms/cm$^2$ or more in all the examples.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A thermal treatment method of a silicon wafer, the method comprising the successive steps of:
   (a) terminating silicon atoms existing on an active surface of the silicon wafer with hydrogen, wherein the active surface is mirror-polished, and a semiconductor device is to be formed on the active surface;
   (b) terminating the silicon atoms existing on the active surface of the silicon wafer with fluorine;
   (c) rapidly heating the silicon wafer to a first temperature under an inert gas atmosphere or a reducing gas atmosphere, wherein the first temperature is in a range of 1300° C. to 1400° C.;
   (d) holding the silicon wafer at the first temperature for a certain time; and
   (e) rapidly cooling the silicon wafer.

2. The method of claim 1, wherein
   step (a) comprises: rinsing the silicon wafer with a hydrogen fluoride-based solution or a hydrogen peroxide-based solution, and
   step (b) comprises: heating the silicon wafer at a second temperature under a fluorine-based gas atmosphere, wherein the second temperature is in a range of 900° C. to 1250° C.

3. A thermal treatment method of a silicon wafer, the method comprising the successive steps of:
   (a) terminating silicon atoms existing on an active surface of the silicon wafer with hydrogen by rinsing the silicon wafer with a hydrogen fluoride-based solution or a hydrogen peroxide-based solution, wherein the active surface is mirror-polished, and a semiconductor device is to be formed on the active surface;
   (b) terminating the silicon atoms existing on the active surface of the silicon wafer with fluorine by heating the silicon wafer at a first temperature under a fluorine-based gas atmosphere, wherein the first temperature is in a range of 900° C. to 1250° C.;
   (c) rapidly heating the silicon wafer from the first temperature to a second temperature under an inert gas atmosphere or a reducing gas atmosphere, wherein the second temperature is in a range of 1300° C. to 1400° C.;
   (d) holding the silicon wafer at the second temperature for a certain time; and
   (e) rapidly cooling the silicon wafer.

4. The method of claim 1,
   wherein step (c) comprises: heating the silicon wafer at a temperature increase rate of 10° C./second to 150° C./second, and
   wherein step (e) comprises: cooling the silicon wafer at a temperature decrease rate of 10° C./second to 150° C./second.

5. The method of claim 3,
   wherein step (c) comprises: heating the silicon wafer at a temperature increase rate of 10° C./second to 150° C./second, and
   wherein step (e) comprises: cooling the silicon wafer at a temperature decrease rate of 10° C./second to 150° C./second.

6. The method of claim 3,
   wherein step (c) comprises: heating the silicon wafer at a temperature increase rate of 10° C./second to 150° C./second, and
   wherein step (e) comprises: cooling the silicon wafer at a temperature decrease rate of 10° C./second to 50° C./second.

7. The method of claim 1, wherein
   the certain time is in a range of 1 to 30 seconds.

8. The method of claim 3, wherein
   the certain time is in a range of 1 to 30 seconds.

* * * * *